United States Patent

Tsai

[11] Patent Number: 5,981,379
[45] Date of Patent: Nov. 9, 1999

[54] METHOD OF FORMING VIA

[75] Inventor: Meng-Jin Tsai, Kaohsiung, Taiwan

[73] Assignee: United Microelectronics Corp., Taiwan

[21] Appl. No.: 09/139,872

[22] Filed: Aug. 25, 1998

[30] Foreign Application Priority Data

Apr. 18, 1998 [TW] Taiwan ................................ 87105973

[51] Int. Cl.$^6$ ..................... H01L 21/4763; H01L 21/302; H01L 23/48
[52] U.S. Cl. ........................ 438/638; 438/637; 438/738; 438/740; 257/774; 257/775
[58] Field of Search .................................... 438/638, 637, 438/624, 634, 734, 738, 740; 257/774, 775, 758, 760

[56] References Cited

U.S. PATENT DOCUMENTS

5,883,436   3/1999   Sadjadi ..................................... 257/760

Primary Examiner—John F. Niebling
Assistant Examiner—Neal Berezny
Attorney, Agent, or Firm—Thomas, Kayden, Horstemeyer & Risley, LLP

[57] ABSTRACT

A method of forming a via. A substrate having a first conductive layer thereon is provided. An inter-metal dielectric layer is formed over the substrate layer by high density plasma chemical vapor deposition. An etch stop layer is formed on the inter-metal dielectric layer. An oxide layer is formed on the etch stop layer. The oxide layer is defined, so that a shallow opening aligned with the first conductive layer is formed to exposed the inter-metal dielectric layer. The inter-metal dielectric layer is etched away within the shallow opening until the first conductive layer is exposed. The opening is filled with a second conductive layer. The oxide layer is defined by photolithography and etching with a first selectivity, with which the oxide layer has a comparable etching rate to the etch stop layer. The inter-metal dielectric layer is etched with a second selectivity, with which the inter-metal dielectric layer has an etching rate higher than the etch stop layer.

7 Claims, 9 Drawing Sheets

METHOD OF FORMING VIA

CROSS-REFERENCE TO RELATED APPLICATION

This application claims priority benefit of Taiwan application Serial no.87105973, filed Apr., 18, 1998, the full disclosure of which is incorporated herein by reference.

BACKGROUND OF THE INVENTION

1. Field of the Invention

The invention relates to a method of forming a via, and more particularly, to a method of forming an unlanded via penetrating through an inter-metal dielectric (IMD).

2. Description of the Related Art

As the integration of semiconductor devices increase, the dimensions of devices cannot supply enough area for interconnection. To match the requirements of the metal oxide semiconductor (MOS) devices with smaller dimensions, designs of multilevel interconnections are adapted in most of the integrated circuits (ICs). Normally, an inter-metal dielectric (IMD) layer is used to isolate two conductive layers. By the formation of a via, the conductive layers are electrically connected.

Figure 1A:
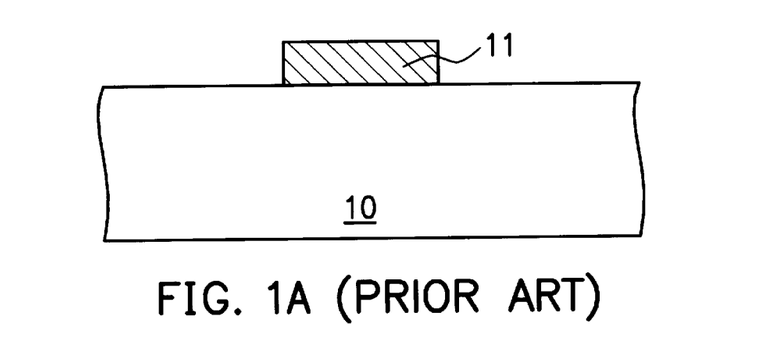
FIG. 1A to FIG. 1F show a conventional method of forming a via.
Figure 1B:
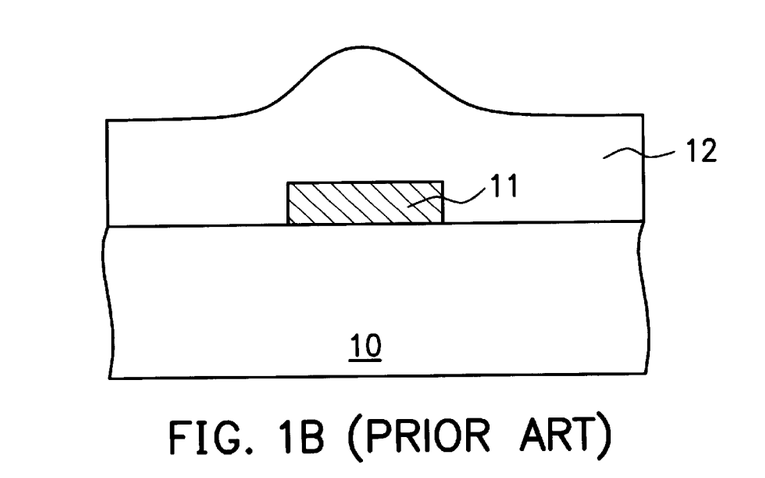

In FIG. 1A to FIG. 1E, a conventional method of forming a via penetrating an inter-metal dielectric layer is shown. In FIG. 1A, a substrate 10 having a conductive layer 11, for example, a metal layer or a poly-silicon layer, formed and defined thereon is provided. In FIG. 1B, an inter-metal dielectric layer 12 is formed over the substrate 10 by chemical vapor deposition (CVD), for example, by atmosphere pressure CVD (APCVD), low pressure CVD (LPCVD), or plasma-enhanced CVD (PECVD).

Figure 1C:
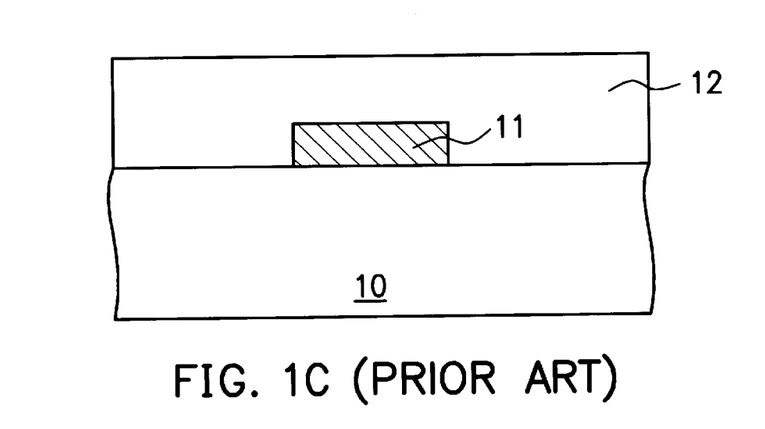

In FIG. 1C, to achieve a global planarization, the inter-metal dielectric layer 12 is polished by chemical-mechanical polishing (CMP).

Figure 1D:
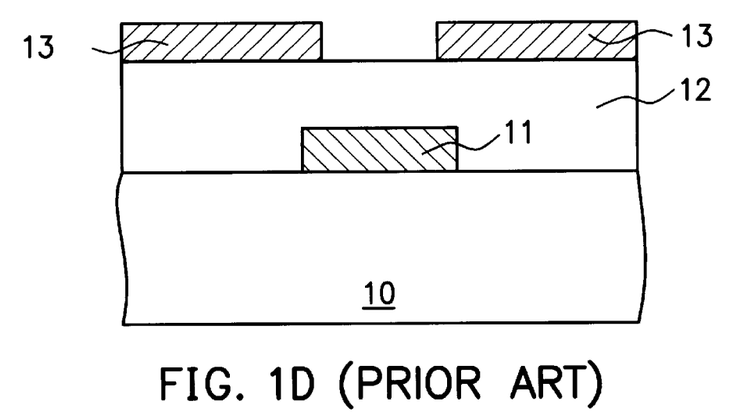
Figure 1E:
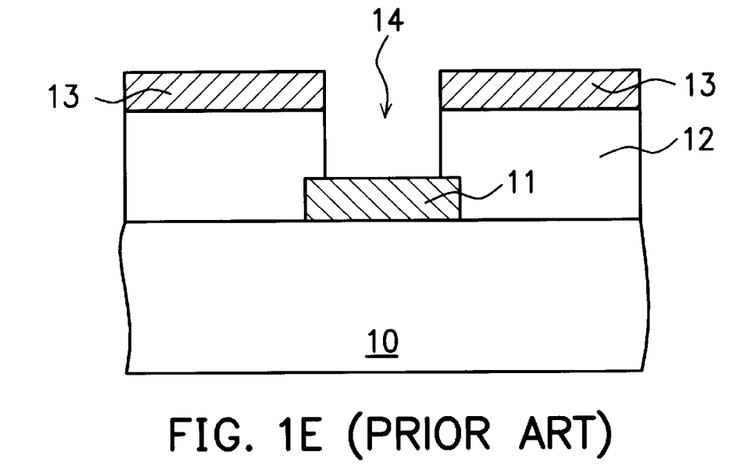

In FIG. 1D and FIG. 1E, forming a photo-resist layer 13 on the inter-metal dielectric layer 12. Using photolithography and etching, the photo-resist layer 13 is defined to form an opening 14, so that the conductive layer 11 is exposed therewithin. The etching is divided into two stages. In the first stage, a main etching is performed. The etching time is estimated in accordance with the material of the inter-metal dielectric layer 12. In the second stage, an over etching is performed. In the first stage, a residue of the inter-metal dielectric layer 12 is remained within the opening 14, so that a poor contact to the conductive layer 11 is caused. Therefore, the second stage is performed to ensure a proper contact to the conductive layer 11. The etching time in the second stage is normally shorter than that in the first stage.

Figure 1F:
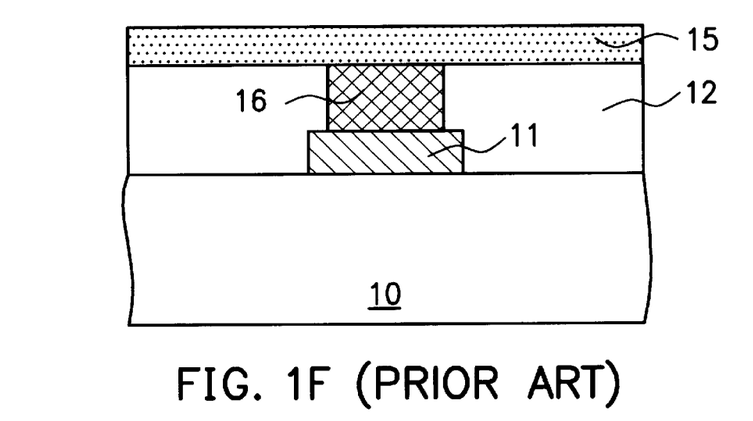

In FIG. 1F, the photo-resist layer 13 is removed. A conductive layer is formed on the inter-metal dielectric layer 12 and fills the opening 14. Using dry etching or chemical-mechanical polishing, the conductive layer is etched back to form a via 16. A metal layer 15 is then formed on the inter-metal dielectric layer 12. The electrical connection between the conductive layer 11 and the metal layer 15 is performed by the conductive layer 16 within the opening 14.

Figure 2:
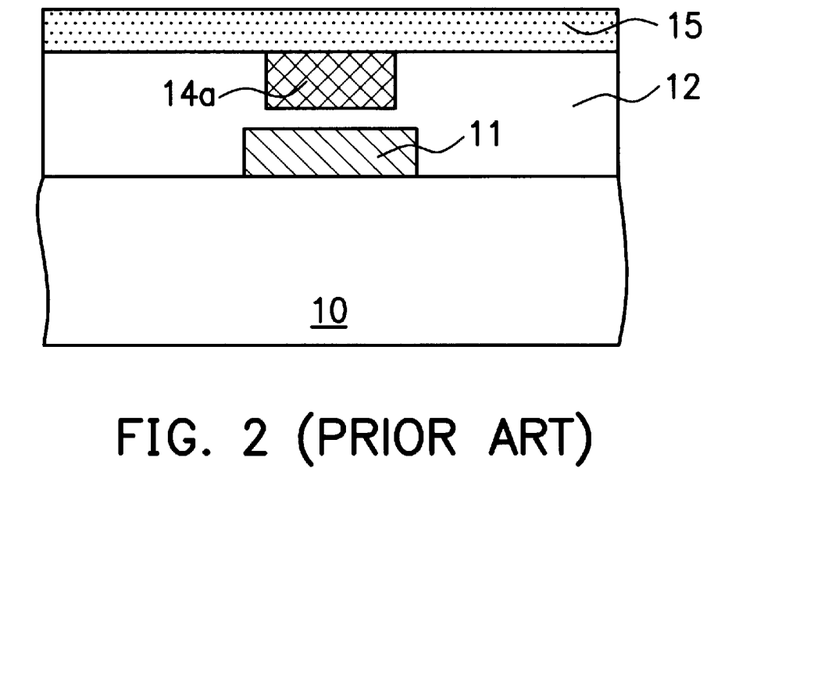
FIG. 2 shows a via structure formed by a conventional method.
Figure 3:
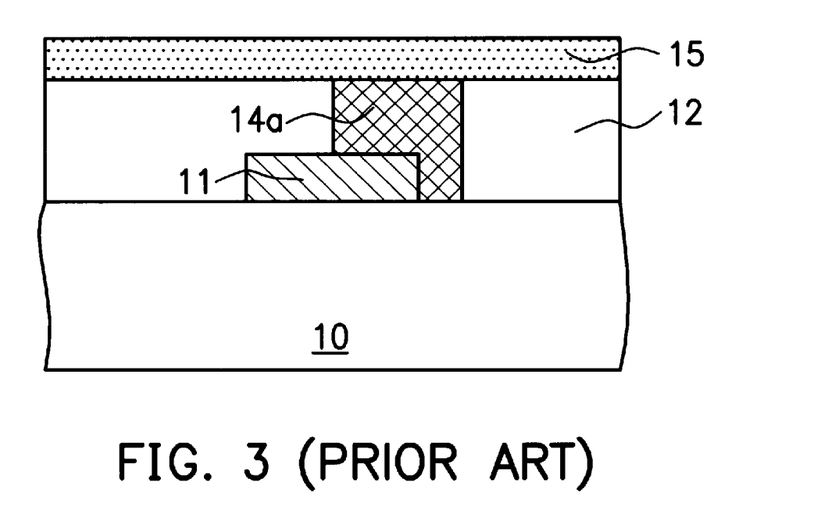
FIG. 3 shows another via structure formed by a conventional method.

Since the etching time is estimated in accordance with the material of the inter-metal dielectric layer, in case of a multi-layer structure or improper time control, a proper contact cannot be obtained. In particularly, as semiconductor devices are designed and developed towards a smaller and smaller dimension, the opening for forming a via becomes narrower and narrower. The aspect ratio is thus larger. In case that etching time is too short, a poor contact occurs as shown in FIG. 2. On the other hand, if a misalignment occurs between the opening and the conductive layer or the etching time is controlled to long, a short circuit occurs as shown in FIG. 3. Moreover, if moisture is absorbed, a void is form in the via.

SUMMARY OF THE INVENTION

It is therefore an object of the invention to provide a method of forming a via. The inter-metal dielectric layer is formed by high density plasma chemical vapor deposition, so that a triangular or a trapezium profile is formed. An etch stop layer and an additional oxide layer is formed on the inter-metal dielectric layer. During etching an opening for forming a via, the remaining etch stop within the opening is functioned as a protection layer. With this protection, a short circuit due to over etch or misalignment is avoided.

To achieve these objects and advantages, and in accordance with the purpose of the invention, as embodied and broadly described herein, the invention is directed towards a method of forming a method of forming a via. A substrate having a first conductive layer thereon is provided. An inter-metal dielectric layer is formed over the substrate layer by high density plasma chemical vapor deposition. An etch stop layer is formed on the inter-metal dielectric layer. An oxide layer is formed on the etch stop layer. The oxide layer is defined, so that a shallow opening aligned with the first conductive layer is formed to exposed the inter-metal dielectric layer. The inter-metal dielectric layer is etched away within the shallow opening until the first conductive layer is exposed. The opening is filled with a second conductive layer. The oxide layer is defined by photolithography and etching with a first selectivity, with which the oxide layer has a comparable etching rate to the etch stop layer. The etch stop layer is used as an etching detecting layer too. The inter-metal dielectric layer is etched with a second selectivity, with which the inter-metal dielectric layer has an etching rate at least five times faster than the etch stop layer.

It is to be understood that both the foregoing general description and the following detailed description are exemplary and explanatory only and are not restrictive of the invention, as claimed.

DESCRIPTION OF THE PREFERRED EMBODIMENTS

Figure 4A:
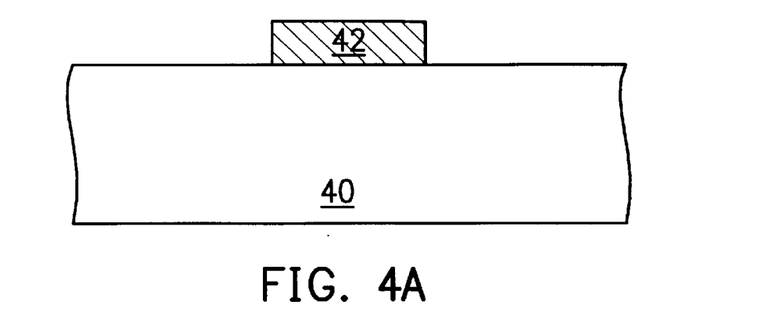
FIG. 4A to FIG. 4H are cross sectional views, in which a method of forming a via in a preferred embodiment according to the invention is shown.

In FIG. 4A to FIG. 4H, a method of forming a via in a preferred embodiment according to the invention is shown. In FIG. 4A, a conductive layer 42, for example, a metal layer or a poly-silicon layer, is formed and defined on a substrate 40.

Figure 4B:
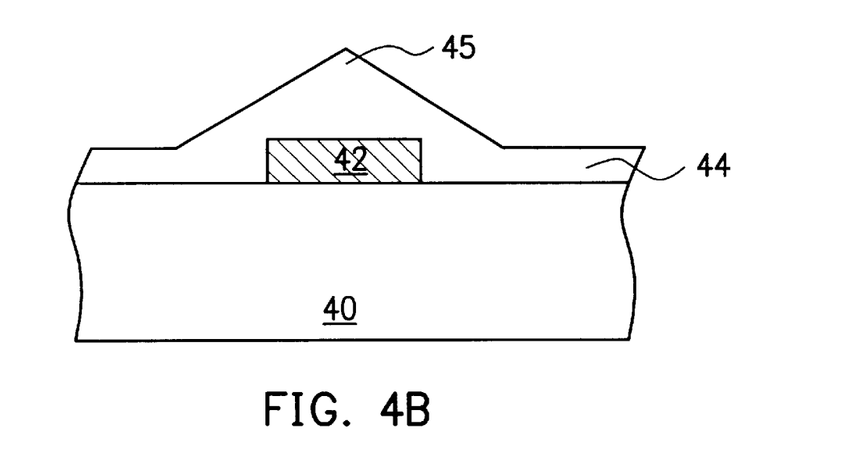

In FIG. 4B, using high density plasma chemical vapor deposition (HDPCVD), an inter-metal dielectric layer 44 is formed on the conductive layer 42 and the substrate 40. As shown in the figure, due to the topography of the conductive layer 42, the inter-metal dielectric layer 44 is not formed with an even profile. Moreover, since a compact deposition layer is obtained by HDPCVD, so that a triangular or trapezium profile 45 is formed on the conductive layer 42.

Figure 4C:
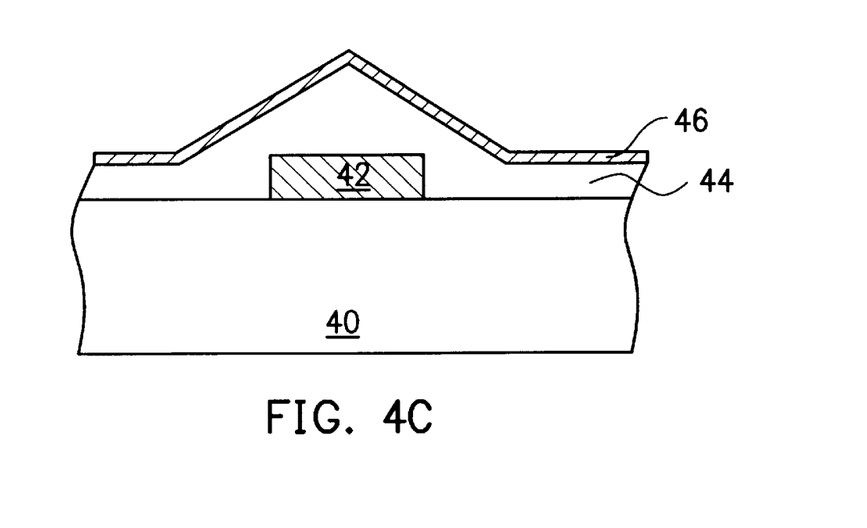

In FIG. 4C, an etch stop layer 46, for example, a silicon nitride layer, is formed on the inter-metal dielectric layer 44. The inter-metal dielectric layer 46 is functioned as an etch stop in a first etching stage.

Figure 4D:
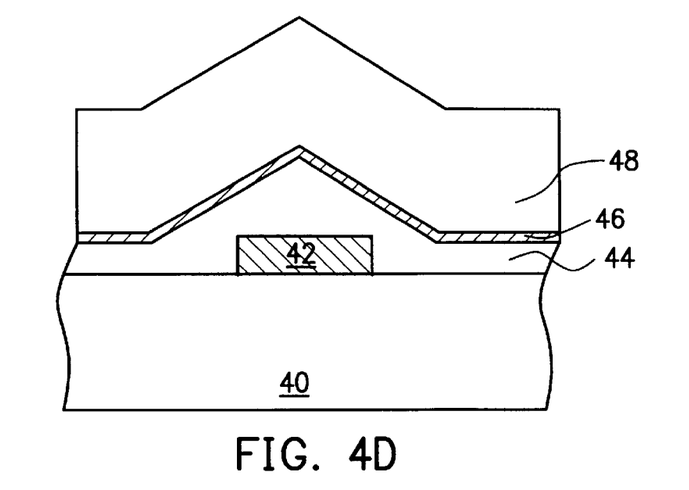

In FIG. 4D, an oxide layer 48 is formed on the etch stop layer 46. The oxide layer is formed, for example, by plasma chemical vapor deposition.

Figure 4E:
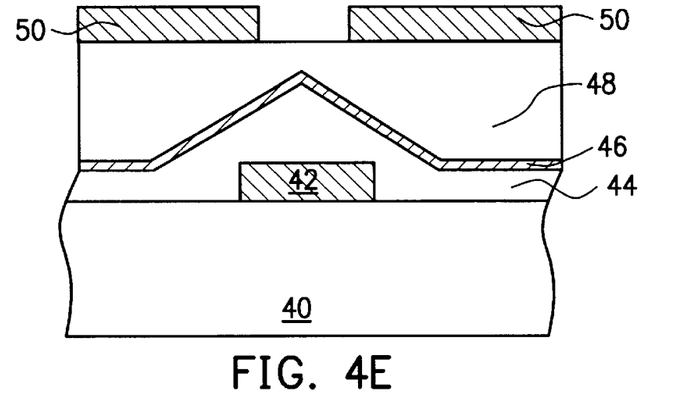
Figure 4F:
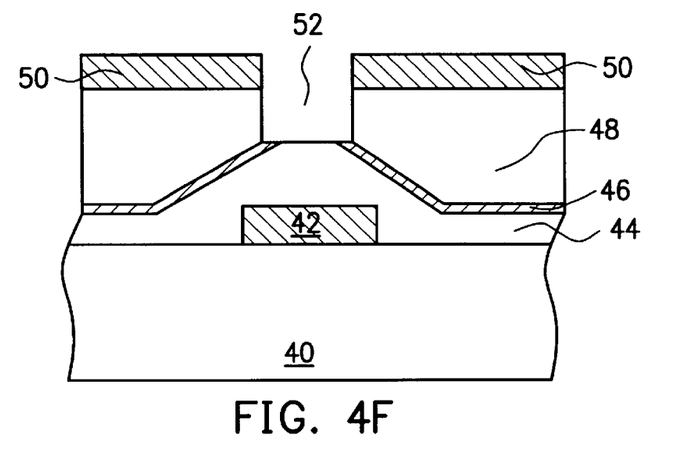

In FIG. 4E, the oxide layer 48 is planarized globally by chemical-mechanical polishing. Using photolithography and etching, a photo-resist layer 50 is formed and defined on the oxide layer 48. A first stage of etching is performed. In the first stage of etching, a selectivity of the etch stop layer 46 to the oxide layer is about 1:1 or 1:2. The oxide layer is thus etched away to form a shallow opening 52, in which the inter-metal dielectric layer 44 is exposed as shown in FIG. 4F.

Figure 4G:
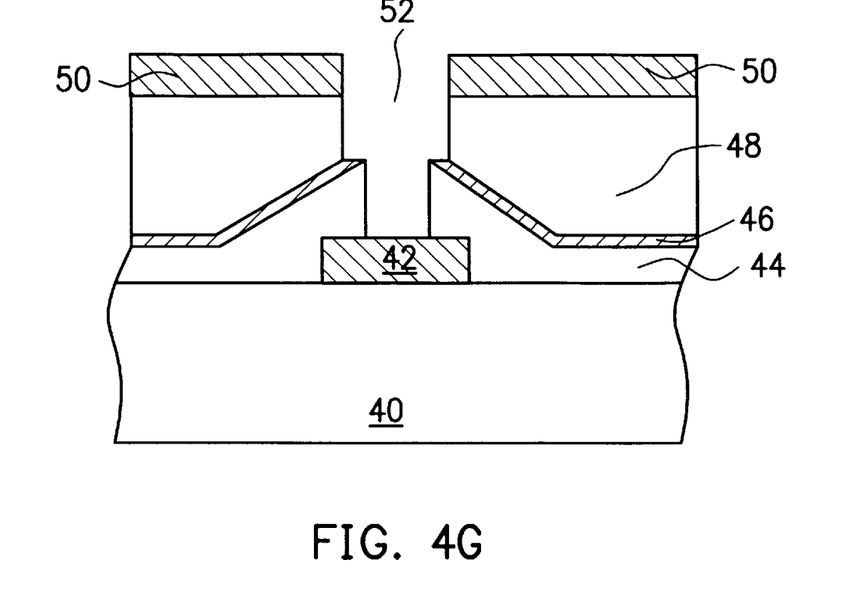

In FIG. 4G, a second stage of etching is performed. In the second stage of etching, a selectivity of the etch stop layer to the inter-metal dielectric layer is about 1:5 to 1:100, preferably 1:10, so that the etching rate of the etch stop layer is far slower than the inter-metal dielectric layer 44. The inter-metal dielectric layer 46 is etched away, that is, the shallow opening 52 is deepened until the conductive layer 42 is exposed. Due the much slower etching rate of the etch stop layer 46 compared to the inter-metal dielectric layer 44, the etch stop layer 46 exposed in the opening 52 is functioned as a protection layer. The inter-metal dielectric layer 44 under the etch stop layer 46, that is, the inter-metal dielectric layer 44 around the edge of the opening 52 is not over etched with this protection layer. Therefore, a short circuit due to misalignment or over etch in the conventional process is prevented.

Figure 4H:
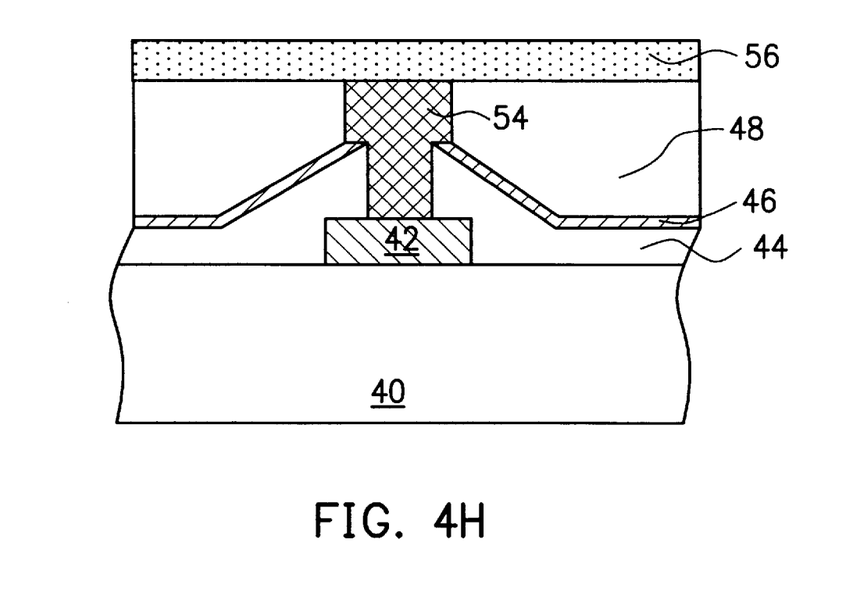

In FIG. 4H, the photo-resist layer 50 is removed. A conductive layer is formed and etched back, for example, by dry etching or chemical-mechanical polishing to form a via 54. Another conductive layer 56 is formed on the inter-metal dielectric layer 44. The electrical connection between the conductive layers 42 and 56 are performed by the via 54.

Figure 5A:
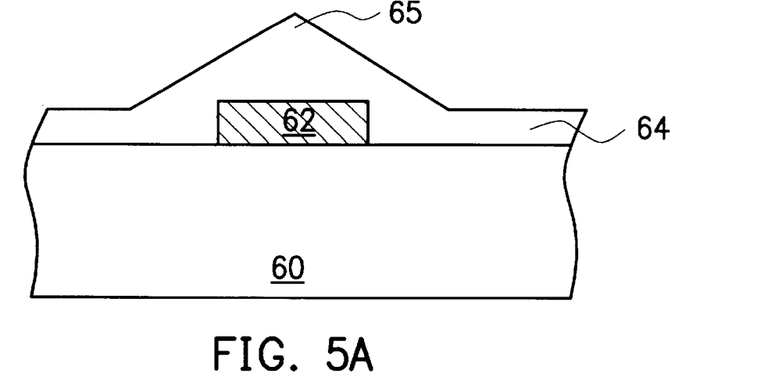
FIG. 5A to FIG. 5G are cross sectional views, in which a method of forming a via under the consideration of a misalignment in a preferred embodiment according to the invention is shown.

FIG. 5A to FIG. 5G shows a method of forming a via according to the invention in case of a misalignment. As shown in FIG. 5A, on a substrate 60, a conductive layer 62 is formed and defined. An inter-metal dielectric layer 64 is formed by HDPCVD on the conductive layer 62 and the substrate 60. The same as the above embodiment, due to the very compact structure of the inter-metal dielectric layer 64 and the topology of the conductive layer 62, a triangular or a trapezium profile 65 of the inter-dielectric layer 64 is formed on the conductive layer 62.

Figure 5B:
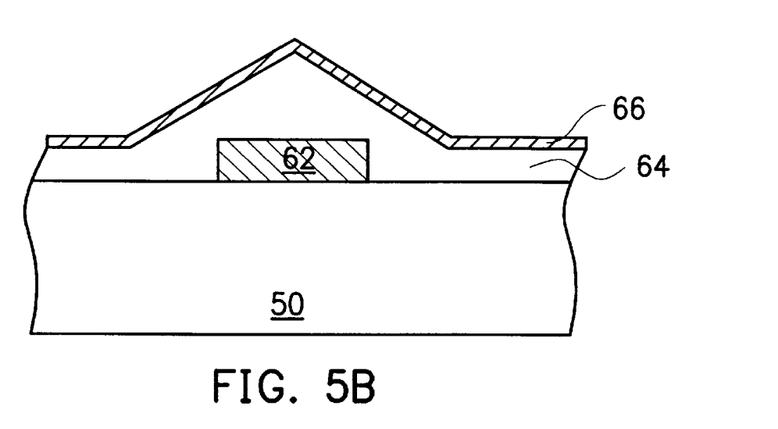
Figure 5C:
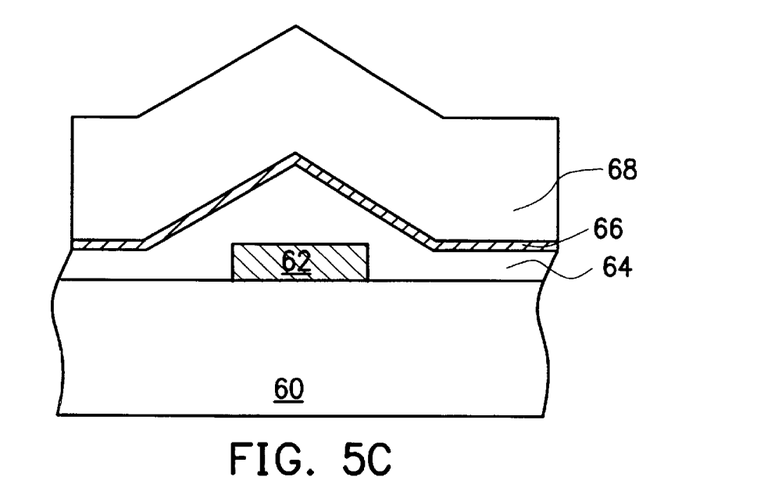
Figure 5D:
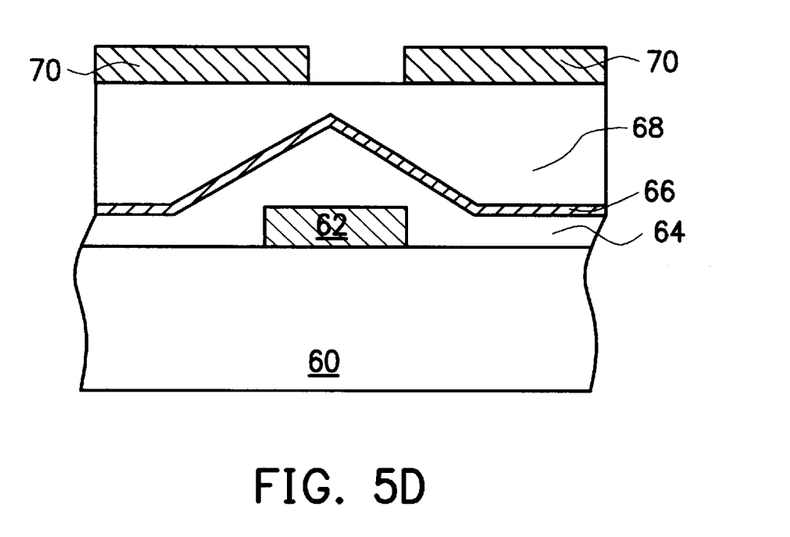

In FIG. 5B, an etch stop layer is formed on the inter-metal dielectric layer 66. In FIG. 5C, an oxide layer 68 is formed on the etch stop layer 66. The oxide layer 68 is planarized as shown in FIG. 5D. Using photolithography and etching, a photo-resist layer 70 is formed and defined on the oxide layer 68.

Figure 5E:
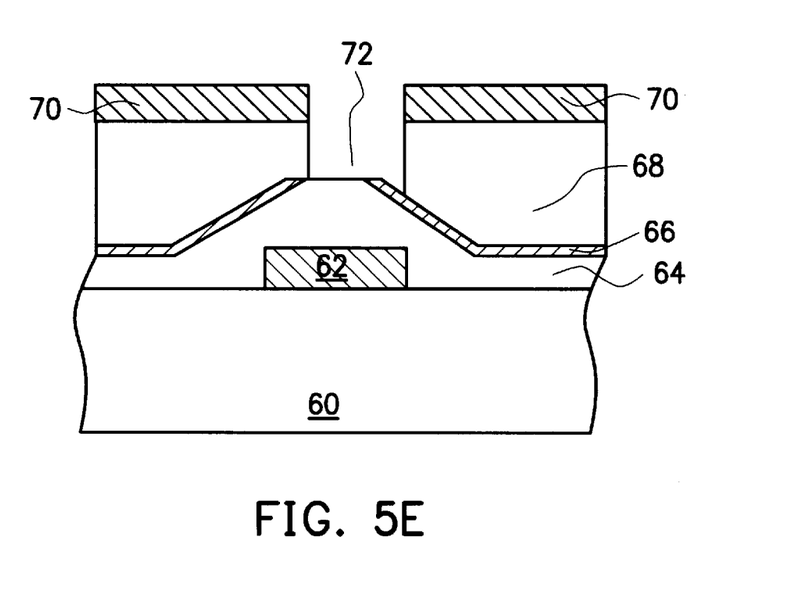

In FIG. 5E, the exposed oxide layer 68 is etched in a first etch stage. In the first stage of etch, a selectivity between the etch stop layer 56 and the oxide layer 68 is about 1:1 or 1:2. An opening 72 is formed. Considering a case of misalignment, as shown in the figure, the opening 72 is not formed aligned with the conductive layer 62 precisely. That is, not only the oxide layer 68 and the etch stop layer 64 on the conductive layer 62 are etched away, a part of the oxide layer 68 and the etch stop layer 66 beyond the range of the conductive layer 62 is to etched and removed.

Figure 5F:
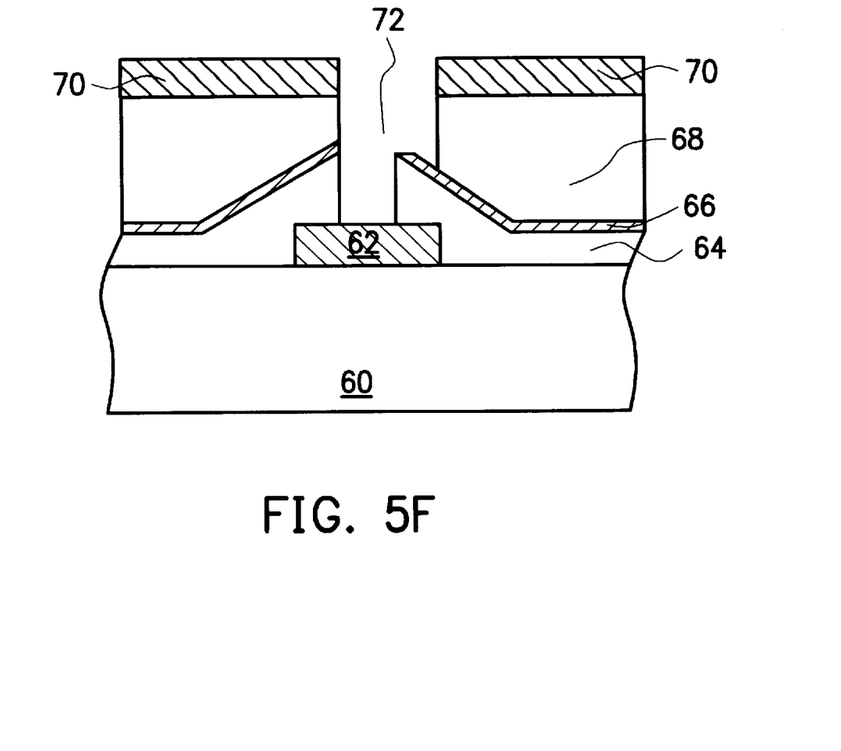
Figure 5G:
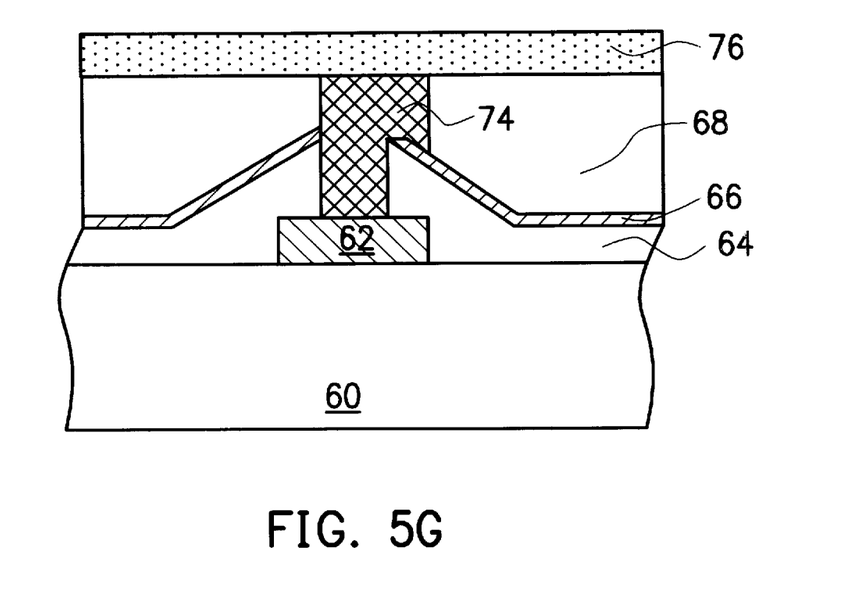

In FIG. 5F, a second stage of etching is performed. In the second stage of etching, a selectivity of the etch stop layer 66 to the inter-metal dielectric layer 64 is about 1:5 to 1:100, preferably, 1:10, so that the etching rate of the etch stop layer 66 is much slow the inter-metal dielectric layer 64. The exposed inter-metal dielectric layer 54 is etched away within the opening 72 to expose the conductive layer 62 within the opening 72. The etch stop layer 66 is functioned as a protection layer. It is apparent from the figure, though a misalignment occurs, the etch stop layer 66 protects the underlying inter-metal dielectric layer 64 from being etched. Therefore, a short circuit caused by misalignment is prevented.

In FIG. 5F, the photo-resist layer 70 is removed. A conductive layer is formed and etched back to form a via 72. Another conductive layer 74 is then formed on the oxide layer 68 and the via 72. The electric connection between the conductive layers 62 and 74 is thus performed by the via 72.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of forming a via, wherein a substrate having a first conductive layer thereon and an inter-metal dielectric layer formed by high density plasma chemical vapor deposition over the substrate is provided, comprising:

forming an etch stop layer on the inter-metal dielectric layer;

forming an oxide layer on the etch stop layer;

forming a shallow opening by etching the oxide layer and the etch stop layer with a first selectivity until the inter-metal dielectric layer is exposed, wherein the shallow opening is formed aligned with the first conductive layer, and with the first selectivity, the etch stop layer has a comparable etching rate to the oxide layer;

deepening the shallow opening by etching with a second selectivity until the first conductive layer is exposed therewithin, wherein with the second selectivity, the inter-metal dielectric layer has an etching rate at least five times faster than the etch stop layer; and filling the opening with a second conductive layer.

2. The method according to claim 1, wherein the etch stop layer includes a silicon nitride.

3. The method according to claim 1, wherein a step of planarizing the oxide layer is further included before forming the shallow opening and after forming the oxide layer.

4. The method according to claim 1, wherein the first selectivity is 1:1 or to 1:2 of the etch stop to the oxide layer layer.

5. The method according to claim 1, wherein second selectivity is 1:5 to 1:100 of the etch stop layer to the inter-metal dielectric layer.

6. The method according to claim 5, wherein second selectivity is 1:10 of the etch stop layer to the inter-metal dielectric layer.

7. A method of forming a via, wherein a substrate having a first conductive layer thereon is provided, comprising:

forming an inter-metal dielectric layer over the substrate layer by high density plasma chemical vapor deposition;

forming an etch stop layer on the inter-metal dielectric layer;

forming an oxide layer on the etch stop layer;

defining the oxide layer, so that a shallow opening aligned with the first conductive layer is formed to exposed the inter-metal dielectric layer;

etching the inter-metal dielectric layer within the shallow opening until the first conductive layer is exposed; and filling the opening with a second conductive layer;

wherein the oxide layer is defined by photolithography and etching with a first selectivity, with which the oxide layer has a comparable etching rate to the etch stop layer; and the inter-metal dielectric layer is etched with a second selectivity, with which the inter-metal dielectric layer has an etching rate at least five times faster than the etch stop layer.

* * * * *